1

(12) United States Patent
Ito et al.

(10) Patent No.: US 8,846,200 B2
(45) Date of Patent: *Sep. 30, 2014

(54) GAS-BARRIER FILM, PROCESS FOR PRODUCING SAME, MEMBER FOR ELECTRONIC DEVICE, AND ELECTRONIC DEVICE

(75) Inventors: Masaharu Ito, Tokyo (JP); Takeshi Kondo, Tokyo (JP); Yuta Suzuki, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/823,688

(22) PCT Filed: Sep. 16, 2011

(86) PCT No.: PCT/JP2011/071203
§ 371 (c)(1),
(2), (4) Date: May 17, 2013

(87) PCT Pub. No.: WO2012/039355
PCT Pub. Date: Mar. 29, 2012

(65) Prior Publication Data
US 2013/0244044 A1    Sep. 19, 2013

(30) Foreign Application Priority Data

Sep. 21, 2010    (JP) ................. 2010-211056

(51) Int. Cl.
*B32B 9/04*        (2006.01)
*B32B 27/00*       (2006.01)
*C08J 7/04*        (2006.01)
*C08J 7/18*        (2006.01)
*C23C 14/14*       (2006.01)
*C23C 14/20*       (2006.01)
*G02F 1/1333*      (2006.01)
*H01L 51/44*       (2006.01)
*C23C 14/48*       (2006.01)
*C09D 5/00*        (2006.01)
*C08J 7/12*        (2006.01)
*H01L 51/52*       (2006.01)

(52) U.S. Cl.
CPC .............. *C09D 5/00* (2013.01); *H01L 51/5253* (2013.01); *C08J 7/047* (2013.01); *C08J 2483/16* (2013.01); *G02F 1/133305* (2013.01); *Y02E 10/549* (2013.01); *C08J 2381/06* (2013.01); *H01L 51/448* (2013.01); *C23C 14/48* (2013.01); *C08J 2369/00* (2013.01); *C08J 7/123* (2013.01); *H01L 2251/5338* (2013.01)
USPC ........... 428/446; 427/489; 427/496; 427/503; 427/525; 427/527; 428/451

(58) Field of Classification Search
USPC .......... 427/489, 496, 503, 525, 527; 428/451, 428/446
See application file for complete search history.

(56) References Cited

U.S. PATENT DOCUMENTS

| | | |
|---|---|---|
| 5,143,747 A | 9/1992 | Matossian et al. |
| 5,458,753 A | 10/1995 | Sato et al. |
| 5,907,382 A | 5/1999 | Kajiura et al. |
| 6,352,931 B1 | 3/2002 | Seta et al. |
| 6,416,817 B1 | 7/2002 | Rangwalla et al. |
| 2002/0034885 A1 | 3/2002 | Shindo |
| 2002/0059899 A1 | 5/2002 | Seta et al. |
| 2002/0063830 A1 | 5/2002 | Callegari et al. |
| 2002/0102843 A1 | 8/2002 | Seta et al. |
| 2003/0224611 A1 | 12/2003 | Seta et al. |
| 2004/0046497 A1 | 3/2004 | Schaepkens et al. |
| 2004/0146660 A1 | 7/2004 | Goodwin et al. |
| 2004/0265554 A1 | 12/2004 | Miyadera et al. |
| 2005/0017633 A1 | 1/2005 | Miyadera |
| 2005/0082674 A1 | 4/2005 | Seta et al. |

(Continued)

FOREIGN PATENT DOCUMENTS

| | | |
|---|---|---|
| JP | 5-185568 A | 7/1993 |
| JP | 6-64105 A | 3/1994 |

(Continued)

OTHER PUBLICATIONS

International Search Report, mailed Nov. 8, 2011, issued in PCT/JP2011/071203.
Extended European Search Report for Application No. 11765502.7 dated Aug. 29, 2013.
International Search Report for International Application No. PCT/JP2009/070728 dated Feb. 9, 2010.
International Search Report for International Application No. PCT/JP2010/052058 dated Jun. 1, 2010.
International Search Report for International Application No. PCT/JP2010/058668 dated Aug. 10, 2010.
International Search Report for International Application No. PCT/JP2011/051507 dated May 10, 2011 (with English translation).
International Search Report for International Application No. PCT/JP2011/071208 dated Nov. 8, 2011.
International Search Report for International Application No. PCT/JP2011/071353 dated Nov. 8, 2011.
Kobayashi et al., "Surface modification of silicone sheets and tubes using plasma-based ion implantation," Surface & Coatings Technology, vol. 201, 2007, pp. 8039-8042.

(Continued)

*Primary Examiner* — D. S. Nakarani
(74) *Attorney, Agent, or Firm* — Birch, Stewart, Kolasch & Birch, LLP

(57) ABSTRACT

The present invention provides a gas barrier film including a base layer, and a gas barrier layer that is provided on at least one side of the base layer, the base layer including a resin having a glass transition temperature (Tg) of more than 130° C., the gas barrier layer being formed of a material that includes at least an oxygen atom and a silicon atom, a surface layer part of the gas barrier layer having an oxygen atom content rate of 60 to 75%, a nitrogen atom content rate of 0 to 10%, and a silicon atom content rate of 25 to 35%, based on a total content rate of oxygen atoms, nitrogen atoms, and silicon atoms, and the surface layer part of the gas barrier layer having a film density of 2.4 to 4.0 g/cm$^3$. Also provided are a process for producing the same, an electronic device member that includes the gas barrier film, and an electronic device that includes the electronic device member. The gas barrier film of the invention exhibits an excellent gas barrier capability, excellent transparency, excellent bending resistance, and excellent heat resistance.

20 Claims, No Drawings

(56) References Cited

U.S. PATENT DOCUMENTS

| | | |
|---|---|---|
| 2005/0202259 A1 | 9/2005 | Korevaar et al. |
| 2005/0287307 A1 | 12/2005 | Singh et al. |
| 2006/0017162 A1 | 1/2006 | Seta et al. |
| 2006/0232735 A1 | 10/2006 | Hokazono et al. |
| 2007/0268089 A1 | 11/2007 | McKenzie et al. |
| 2008/0096014 A1 | 4/2008 | Griesser et al. |
| 2009/0021150 A1 | 1/2009 | Kim et al. |
| 2009/0022907 A1 | 1/2009 | Kim et al. |
| 2009/0110892 A1 | 4/2009 | Erlat et al. |
| 2009/0130463 A1 | 5/2009 | Albaugh et al. |
| 2009/0139564 A1 | 6/2009 | Miyaji et al. |
| 2009/0148633 A1 | 6/2009 | Inagaki et al. |
| 2010/0003482 A1 | 1/2010 | Fukuda |
| 2010/0003483 A1 | 1/2010 | Fukuda |
| 2011/0185948 A1 | 8/2011 | Uemura et al. |
| 2011/0189450 A1 | 8/2011 | Hoshi et al. |
| 2011/0274933 A1 | 11/2011 | Hoshi et al. |
| 2012/0064321 A1 | 3/2012 | Suzuki et al. |
| 2012/0101221 A1 | 4/2012 | Hoshi et al. |
| 2012/0108761 A1 | 5/2012 | Hoshi et al. |
| 2012/0295120 A1* | 11/2012 | Nagamoto et al. ............ 428/447 |

FOREIGN PATENT DOCUMENTS

| | | |
|---|---|---|
| JP | 6-187833 A | 7/1994 |
| JP | 8-45452 A | 2/1996 |
| JP | 8-57560 A | 3/1996 |
| JP | 8-174748 A | 7/1996 |
| JP | 8-302043 A | 11/1996 |
| JP | 9-10687 A | 1/1997 |
| JP | 9-26755 A | 1/1997 |
| JP | 9-124807 A | 5/1997 |
| JP | 10-244613 A | 9/1998 |
| JP | 10-249990 A | 9/1998 |
| JP | 10-305542 A | 11/1998 |
| JP | 2000-246830 A | 9/2000 |
| JP | 2000-254996 A | 9/2000 |
| JP | 2000-260870 A | 9/2000 |
| JP | 2000-338901 A | 12/2000 |
| JP | 2001-119051 A | 4/2001 |
| JP | 2002-18246 A | 1/2002 |
| JP | 2002-105676 A | 4/2002 |
| JP | 2003-8179 A | 1/2003 |
| JP | 2003-154596 A | 5/2003 |
| JP | 2003-525995 A | 9/2003 |
| JP | 2003-347570 A | 12/2003 |
| JP | 2004-119138 A | 4/2004 |
| JP | 2004-527642 A | 9/2004 |
| JP | 2004-530790 A | 10/2004 |
| JP | 2004-322489 A | 11/2004 |
| JP | 2004-352966 A | 12/2004 |
| JP | 2005-88431 A | 4/2005 |
| JP | 2005-104025 A | 4/2005 |
| JP | 2005-119155 A | 5/2005 |
| JP | 2005-119160 A | 5/2005 |
| JP | 2005-169994 A | 6/2005 |
| JP | 2005-231039 A | 9/2005 |
| JP | 2005-240061 A | 9/2005 |
| JP | 2005-537963 A | 12/2005 |
| JP | 2006-35737 A | 2/2006 |
| JP | 2006-52376 A | 2/2006 |
| JP | 2006-70238 A | 3/2006 |
| JP | 2006-123306 A | 5/2006 |
| JP | 2006-123307 A | 5/2006 |
| JP | 2006-264118 A | 10/2006 |
| JP | 2007-22075 A | 2/2007 |
| JP | 2007-42616 A | 2/2007 |
| JP | 2007-65644 A | 3/2007 |
| JP | 2007-237588 A | 9/2007 |
| JP | 2007-528447 A | 10/2007 |
| JP | 2007-283726 A | 11/2007 |
| JP | 2008-15500 A | 1/2008 |
| JP | 2008-504687 A | 2/2008 |
| JP | 2008-49601 A | 3/2008 |
| JP | 2008-62498 A | 3/2008 |
| JP | 2008-174792 A | 7/2008 |
| JP | 2008-204683 A | 9/2008 |
| JP | 2008-235165 A | 10/2008 |
| JP | 2008-246893 A | 10/2008 |
| JP | 2008-270115 A | 11/2008 |
| JP | 2009-110897 A | 5/2009 |
| JP | 2009-199812 A | 9/2009 |
| JP | 2009-287006 A | 12/2009 |
| JP | WO 2010/024378 A1 | 3/2010 |
| JP | 2011-718 A | 1/2011 |
| WO | WO 2006/090602 A1 | 8/2006 |
| WO | WO 2007/040039 A1 | 4/2007 |
| WO | WO 2007/044181 A2 | 4/2007 |
| WO | WO 2008/096617 A1 | 8/2008 |
| WO | WO 2010/021326 A1 | 2/2010 |
| WO | WO 2010/067857 A1 | 6/2010 |
| WO | WO 2010/107018 A1 | 9/2010 |
| WO | WO 2010/134609 A1 | 11/2010 |
| WO | WO 2010/134611 A1 | 11/2010 |

OTHER PUBLICATIONS

Nakagawara et al., "Moisture-resistant ZnO transparent conductive films with Ga heavy doping", Applied Physics Letters, vol. 89, 2006, pp. 091904-1-091904-3.

Schauer et al., "Luminescence as a tool for crosslinking determination in plasma polysilylenes prepared from organosilanes", Synthetic Metals, vol. 109, 2000, pp. 321-325.

United States Office Action for copending U.S. Appl. No. 13/055,274 dated Nov. 7, 2013.

United States Office Action for copending U.S. Appl. No. 13/128,348 dated Feb. 14, 2013.

United States Office Action for copending U.S. Appl. No. 13/128,348 dated Sep. 13, 2013.

United States Office Action for copending U.S. Appl. No. 13/144,856 dated Mar. 15, 2013.

United States Office Action for copending U.S. Appl. No. 13/144,856 dated Oct. 18, 2013.

United States Office Action for copending U.S. Appl. No. 13/256,143 dated Nov. 21, 2013.

United States Office Action for copending U.S. Appl. No. 13/321,687 dated Jan. 15, 2014.

United States Office Action for copending U.S. Appl. No. 13/321,687 dated Oct. 8, 2013.

United States Office Action for copending U.S. Appl. No. 13/826,954 dated Nov. 7, 2013.

International Search Report for International Application No. PCT/JP2009/064457 dated Dec. 1, 2009.

International Search Report for International Application No. PCT/JP2010/055064 dated May 11, 2010.

International Search Report for International Application No. PCT/JP2011/057608 dated Apr. 26, 2011.

International Search Report for International Application No. PCT/JP2011/057610 dated Jul. 5, 2011.

United States Office Action for U.S. Appl. No. 13/055,274 dated Apr. 16, 2013.

United States Office Action for U.S. Appl. No. 13/256,143 dated Aug. 6, 2013.

Notice of Allowance issued Apr. 29, 2014, in U.S. Appl. No. 13/256,143.

Notice of Allowance issued Feb. 28, 2014, in U.S. Appl. No. 13/826,954.

* cited by examiner

GAS-BARRIER FILM, PROCESS FOR PRODUCING SAME, MEMBER FOR ELECTRONIC DEVICE, AND ELECTRONIC DEVICE

TECHNICAL FIELD

The invention relates to a gas barrier film that includes a base layer that is formed of a heat-resistant resin having a high glass transition temperature (Tg), a process for producing the same, an electronic device member that includes the gas barrier film, and an electronic device that includes the electronic device member.

BACKGROUND ART

A polymer gas barrier film (e.g., plastic film) that is inexpensive and exhibits excellent workability has been provided with a desired function, and used in various fields.

For example, a gas barrier plastic film that does not allow water vapor and oxygen to pass through has been used as a food/drug packaging film in order to suppress oxidation and denaturation of proteins, oils, fats, and the like to keep taste and freshness. In recent years, use of a transparent plastic film as an electrode substrate instead of a glass plate has been studied for displays (e.g., liquid crystal display and electroluminescence (EL) display) in order to implement a reduction in thickness, a reduction in weight, an improvement in flexibility, and the like.

For example, Patent Document 1 discloses a flexible display substrate in which a transparent gas barrier layer formed of a metal oxide is stacked on a transparent plastic film, and Patent Document 2 discloses a gas barrier film that includes a polysilazane film that is formed on at least one side of a film, and subjected to a plasma treatment.

However, the gas barrier films disclosed in Patent Documents 1 and 2 have a problem in that cracks may occur in the gas barrier layer so that the gas barrier capability may decrease, or a sufficient gas barrier capability may not be obtained unless the thickness of the gas barrier layer is increased to a micrometer level. Moreover, since a plastic film tends to allow water vapor, oxygen, and the like to pass through as compared with a glass plate, elements provided in a display may deteriorate. The gas barrier films disclosed in Patent Documents 1 and 2 may also exhibit poor transparency and heat resistance.

RELATED-ART DOCUMENT

Patent Document

Patent Document 1: JP-A-2000-338901
Patent Document 2: JP-A-2007-237588

SUMMARY OF THE INVENTION

Technical Problem

The invention was conceived in view of the above situation. An object of the invention is to provide a gas barrier film that exhibits an excellent gas barrier capability, excellent transparency, excellent bending resistance, and excellent heat resistance, a process for producing the same, an electronic device member that includes the gas barrier film, and an electronic device that includes the electronic device member.

Solution to Problem

The inventors conducted extensive studies in order to achieve the above object. As a result, the inventors found that a gas barrier film that includes a base layer, and a gas barrier layer that is provided on at least one side of the base layer, the base layer including a resin having a glass transition temperature (Tg) of more than 130° C., the gas barrier layer being formed of a material that includes at least an oxygen atom and a silicon atom, a surface layer part of the gas barrier layer having a specific oxygen atom content rate, a specific nitrogen atom content rate, and a specific silicon atom content rate, and having a specific film density, exhibits an excellent gas barrier capability, excellent transparency, and excellent heat resistance. The inventors also found that such a gas barrier film can be easily and efficiently produced by forming a polysilazane compound-containing layer on a base, and implanting ions into the polysilazane compound-containing layer. These findings have led to the completion of the invention.

A first aspect of the invention provides the following gas barrier film (see (1) to (8)).

(1) A gas barrier film including a base layer, and a gas barrier layer that is provided on at least one side of the base layer, the base layer including a resin having a glass transition temperature (Tg) of more than 130° C., the gas barrier layer being formed of a material that includes at least an oxygen atom and a silicon atom, a surface layer part of the gas barrier layer having an oxygen atom content rate of 60 to 75%, a nitrogen atom content rate of 0 to 10%, and a silicon atom content rate of 25 to 35%, based on a total content rate of oxygen atoms, nitrogen atoms, and silicon atoms, and the surface layer part of the gas barrier layer having a film density of 2.4 to 4.0 g/cm$^3$.

(2) The gas barrier film according to (1), wherein the material that forms the gas barrier layer includes a polysilazane compound.

(3) The gas barrier film according to (1) or (2), wherein the gas barrier layer is obtained by implanting ions into a polysilazane compound-containing layer.

(4) The gas barrier film according to (3), wherein the ions are obtained by ionizing at least one gas selected from a group consisting of hydrogen, nitrogen, oxygen, argon, helium, neon, xenon, krypton, a silicon compound, and a hydrocarbon.

(5) The gas barrier film according to (3) or (4), wherein the gas barrier layer is obtained by implanting the ions into the polysilazane compound-containing layer by a plasma ion implantation method.

(6) The gas barrier film according to any one of (2) to (5), wherein the polysilazane compound is perhydropolysilazane.

(7) The gas barrier film according to any one of (1) to (6), wherein the base layer includes at least one resin selected from a group consisting of a polysulfone resin, a polyallylate resin, and an alicyclic hydrocarbon resin.

(8) The gas barrier film according to any one of (1) to (7), the gas barrier film having a haze value of 8.0% or less.

A second aspect of the invention provides the following process for producing a gas barrier film (see (9) to (11)).

(9) A process for producing the gas barrier film according to any one of (2) to (8), the process including forming a polysilazane compound-containing layer on a base layer that includes a resin having a glass transition temperature (Tg) of more than 130° C., and implanting ions into a surface area of the polysilazane compound-containing layer.

(10) The process according to (9), including forming a polysilazane compound-containing layer on a base layer that includes a resin having a glass transition temperature (Tg) of more than 130° C., and implanting ions of at least one gas selected from a group consisting of hydrogen, nitrogen, oxygen, argon, helium, neon, xenon, krypton, a silicon compound, and a hydrocarbon into a surface area of the polysilazane compound-containing layer.

(11) The process according to (9), including forming a polysilazane compound-containing layer on a base layer that includes a resin having a glass transition temperature (Tg) of more than 130° C., and implanting ions of at least one gas selected from a group consisting of hydrogen, nitrogen, oxygen, argon, helium, neon, xenon, krypton, a silicon compound, and a hydrocarbon into a surface area of the polysilazane compound-containing layer by a plasma ion implantation method.

A third aspect of the invention provides the following electronic device member (see (12)).

(12) An electronic device member including the gas barrier film according to any one of (1) to (8).

A fourth aspect of the invention provides the following electronic device (see (13)).

(13) An electronic device including the electronic device member according to (12).

Advantageous Effects of the Invention

The gas barrier film according to the first aspect of the invention exhibits an excellent gas barrier capability, excellent transparency, excellent bending resistance, and excellent heat resistance. Therefore, the gas barrier film may suitably be used as an electronic device member for solar cells, touch panels, electronic paper, displays, and the like.

The process for producing a gas barrier film according to the second aspect of the invention can easily and efficiently produce the gas barrier film that exhibits an excellent gas barrier capability, excellent transparency, excellent bending resistance, and excellent heat resistance. Moreover, an increase in area of the gas barrier film can be easily achieved at low cost as compared with the case of depositing an inorganic film.

Since the electronic device member according to the third aspect of the invention includes the gas barrier film according to the first aspect of the invention that exhibits an excellent gas barrier capability, excellent transparency, excellent bending resistance, and excellent heat resistance, the electronic device member may suitably be used for electronic devices such as touch panels, electronic paper, flexible displays such as organic and inorganic EL displays, and solar cells.

DESCRIPTION OF EMBODIMENTS

A gas barrier film, a process for producing a gas barrier film, an electronic device member, and an electronic device according to several embodiments of the invention are described in detail in below.

1) Gas Barrier Film

A gas barrier film according to one embodiment of the invention includes a base layer, and a gas barrier layer that is provided on at least one side of the base layer, the base layer including a resin having a glass transition temperature (Tg) of more than 130° C., the gas barrier layer being formed of a material that includes at least an oxygen atom and a silicon atom, a surface layer part of the gas barrier layer having an oxygen atom content rate of 60 to 75%, a nitrogen atom content rate of 0 to 10%, and a silicon atom content rate of 25 to 35%, based on the total content rate of oxygen atoms, nitrogen atoms, and silicon atoms, and the surface layer part of the gas barrier layer having a film density of 2.4 to 4.0 g/cm$^3$.

Base Layer

The gas barrier film according to one embodiment of the invention includes the base layer that includes a resin having a glass transition temperature (Tg) of more than 130° C.

A material for forming the base layer is not particularly limited as long as the material includes a resin having a glass transition temperature of more than 130° C. It is preferable that the resin included in the base layer have a glass transition temperature of 135° C. or more, and more preferably 150° C. or more, from the viewpoint of obtaining more advantageous effects. A gas barrier film that exhibits an excellent gas barrier capability, transparency, bending resistance, and heat resistance can be obtained by utilizing a resin having a glass transition temperature within the above range as the material for forming the base layer.

If the glass transition temperature of the resin is 130° C. or less, the base layer may become cloudy, or a significant decrease in transparency may occur, when the base layer is subjected to a high temperature (e.g., when the gas barrier film is used outdoors, or when the gas barrier layer is dried by heating (described later)). Moreover, it may be difficult to form the gas barrier layer, or the base layer may significantly curl up or shrink due to softening of the base layer.

The resin having a glass transition temperature of more than 130° C. is not particularly limited. Examples of the resin having a glass transition temperature of more than 130° C. include polysulfone resins, polyallylate resins, polycarbonate resins, polyimide resins, polyamide resins, polyamide-imide resins, cycloolefin polymers, polyphenylene ether resins, polyetherketone resins, polyether ether ketone resins, liquid crystal polyester resins, alicyclic hydrocarbon resins, and the like.

Among these, polysulfone resins, polyallylate resins, polycarbonate resins, polyimide resins, polyamide resins, polyamide-imide resins, and alicyclic hydrocarbon resins are preferable, and polysulfone resins, polyallylate resins, and alicyclic hydrocarbon resins are particularly preferable due to excellent heat resistance, excellent transparency, and versatility.

These resins may be used either alone or in combination.

The content of the resin having a glass transition temperature (Tg) of more than 130° C. in the base layer is preferably 50 wt % or more, more preferably 70 wt % or more, and still more preferably 85 wt % or more.

A polysulfone resin is a polymer that includes a repeating unit represented by any of the following formulas (a) to (h).

[Chemical Formula 1]

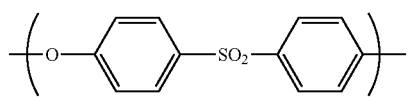

(a)

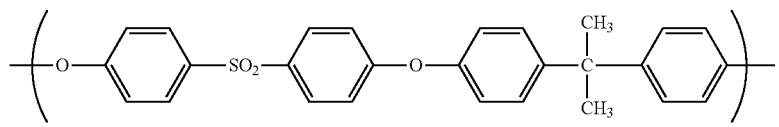

(b)

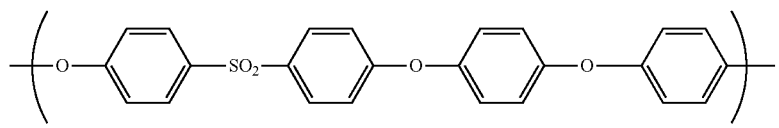

(c)

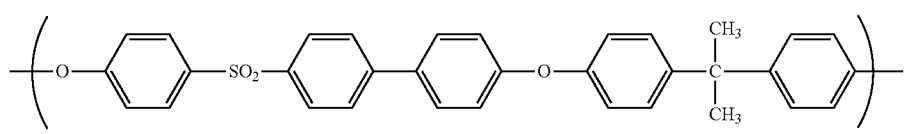

(d)

[Chemical Formula 2]

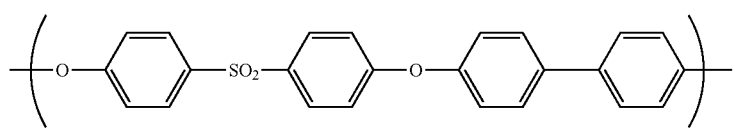

(e)

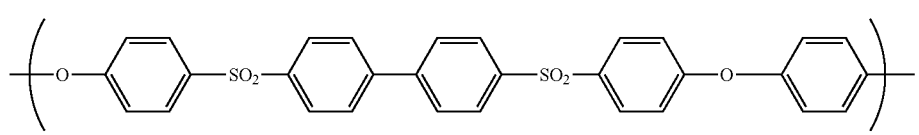

(f)

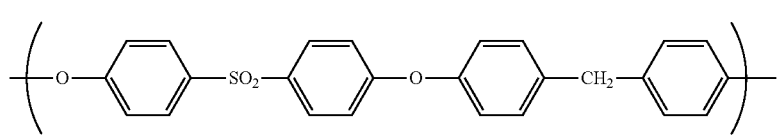

(g)

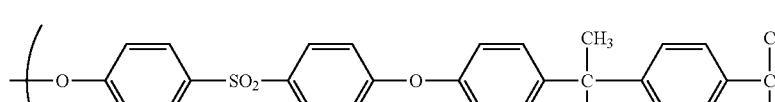

(h)

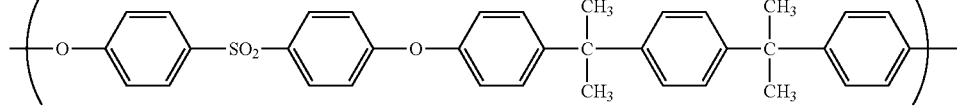

Specific examples of the polysulfone resin include polysulfone, polyethersulfone, polyphenylsulfone, a modified polysulfone film, and the like.

A polyallylate resin is a polymer obtained by reacting an aromatic diol with an aromatic dicarboxylic acid or a chloride thereof. The reaction method is not particularly limited. For example, a melt polymerization method, a solution polymerization method, or an interfacial polymerization method may be used.

Examples of the aromatic diol include bis(hydroxyphenyl) alkanes such as bis(4-hydroxyphenyl)methane (bisphenol F), bis(3-methyl-4-hydroxyphenyl)methane, 1,1-bis(4'-hydroxyphenyl)ethane, 1,1-bis(3'-methyl-4'-hydroxyphenyl)ethane, 2,2-bis(4'-hydroxyphenyl)propane (bisphenol A), 2,2-bis(3'-methyl-4'-hydroxyphenyl)propane, 2,2-bis(4'-hydroxyphenyl)butane, and 2,2-bis(4'-hydroxyphenyl)octane, bis(hydroxyphenyl)cycloalkanes such as 1,1-bis(4'-hydroxyphenyl)cyclopentane, 1,1-bis(4'-hydroxyphenyl)cyclohexane (bisphenol Z), and 1,1-bis(4'-hydroxyphenyl)-3,3,5-trimethylcyclohexane, bis(hydroxyphenyl)phenylalkanes such as bis(4-hydroxyphenyl)phenylmethane, bis(3-methyl-4-hydroxyphenyl)phenylmethane, bis(2,6-dimethyl-4-hydroxyphenyl)phenylmethane, bis(2,3,6-trimethyl-4-hydroxyphenyl)phenylmethane, bis(3-t-butyl-4-hydroxyphenyl)phenylmethane, bis(3-phenyl-4-hydroxyphenyl)phenylmethane, bis(3-fluoro-4-hydroxyphenyl)phenylmethane, bis(3-bromo-4-hydroxyphenyl)phenylmethane, bis(4-hydroxyphenyl)-4-fluorophenylmethane, bis(3-fluoro-4-hydroxyphenyl)-4-fluorophenylmethane, bis(4-hydroxyphenyl)-4-chlorophenylmethane, bis(4-hydroxyphenyl)-4-bromophenylmethane, bis(3,5-dimethyl-4-hydroxyphenyl)-4-fluorophenylmethane, 1,1-bis(4'-hydroxyphenyl)-1-phenylethane (bisphenol P), 1,1-bis(3'-methyl-4'-hydroxyphenyl)-1-phenylethane, 1,1-bis(3'-t-butyl-4'-hydroxyphenyl)-1-phenylethane, 1,1-bis(3'-phenyl-4'-hydroxyphenyl)-1-phenylethane, 1,1-bis(4'-hydroxyphenyl)-1-(4'-nitrophenyl)ethane, 1,1-bis(3'-bromo-4'-hydroxyphenyl)-1-phenylethane, 1,1-bis(4'-hydroxyphenyl)-1-phenylpropane, bis(4-hydroxyphenyl)diphenylmethane, and bis(4-hydroxyphenyl)dibenzylmethane, bis(hydroxyphenyl)ethers such as bis(4-hydroxyphenyl)ether and bis(3-methyl-4-hydroxyphenyl)ether, bis(hydroxyphenyl) ketones such as bis(4-hydroxyphenyl) ketone and bis(3-methyl-4-hydroxyphenyl) ketone, bis(hydroxyphenyl) sulfides such as bis(4-hydroxyphenyl)sulfide and bis(3-methyl-4-hydroxyphenyl)sulfide, bis(hydroxyphenyl) sulfoxides such as bis(4-hydroxyphenyl)

sulfoxide and bis(3-methyl-4-hydroxyphenyl)sulfoxide, bis(hydroxyphenyl)sulfones such as bis(4-hydroxyphenyl)sulfone (bisphenol S) and bis(3-methyl-4-hydroxyphenyl)sulfone, bis(hydroxyphenyl)fluorenes such as 9,9-bis(4'-hydroxyphenyl)fluorene and 9,9-bis(3'-methyl-4'-hydroxyphenyl)fluorene, and the like.

Examples of the aromatic dicarboxylic acid or a chloride thereof include phthalic acid, isophthalic acid, terephthalic acid, 4,4'-diphenyldicarboxylic acid, 4,4'-diphenoxyethanedicarboxylic acid, 4,4'-diphenyl ether dicarboxylic acid, 4,4'-diphenylsulfonedicarboxylic acid, 1,5-napthalenedicarboxylic acid, 2,6-napthalenedicarboxylic acid, chlorides thereof, and the like.

Examples of the alicyclic hydrocarbon resins include monocyclic olefin polymers, norbornene polymers, cyclic conjugated diene polymers, vinyl alicyclic hydrocarbon polymers, and hydrogenated products thereof. Specific examples of the alicyclic hydrocarbon resins include APEL (ethylene-cycloolefin copolymer manufactured by Mitsui Chemicals Inc.), ARTON (norbornene polymer manufactured by JSR Corporation), ZEONOR (norbornene polymer manufactured by Zeon Corporation), and the like.

The base layer may include an additional component as long as the object and the advantageous effects of the invention are not impaired. Examples of the additional component include a plasticizer, energy-curable resins (e.g., UV-curable resin and epoxy resin), and the like.

The base layer may be formed by an arbitrary method. For example, the base layer may be formed by a method that dissolves pellets of the resin in an appropriate solvent optionally together with the additional component to prepare a base layer-forming composition, applies the base layer-forming composition to an appropriate substrate (e.g., polyethylene terephthalate (PET)), dries the base layer-forming composition by heating, and removes the resulting film from the substrate, a method that extrusion-forms a film using a resin composition prepared by mixing the resin optionally together with the additional component, a method that utilizes an inflation molding method, or the like.

A commercially available product (film) may be used directly as the base layer.

The thickness of the base layer is not particularly limited, and may be determined depending on the application of the gas barrier film. The thickness of the base layer is normally 0.5 to 500 μm, and preferably 1 to 100 μm.

According to the embodiments of the invention, curling, cloudiness, shrinkage, and the like do not occur when the gas barrier layer is dried by heating, or a decrease in transparency due to a plasticizer or the like does not occur, even if the thickness of the base layer is reduced depending on the application of the gas barrier film.

Gas Barrier Layer

The gas barrier film according to one embodiment of the invention includes the gas barrier layer that is provided on the base layer.

The gas barrier layer meets the following requirements (a) to (c).

(a) The gas barrier layer is formed of a material that includes at least an oxygen atom and a silicon atom.

(b) The surface layer part of the gas barrier layer has an oxygen atom content rate of 60 to 75% (preferably 60 to 72%, and more preferably 63 to 70%), a nitrogen atom content rate of 0 to 10% (preferably 0.1 to 8%, and more preferably 0.1 to 6%), and a silicon atom content rate of 25 to 35% (preferably 27 to 35%, and more preferably 29 to 32%), based on the total content rate of oxygen atoms, nitrogen atoms, and silicon atoms.

(c) The surface layer part of the gas barrier layer has a film density of 2.4 to 4.0 $g/cm^3$.

The term "surface layer part" used herein in connection with the gas barrier layer refers to the surface of the gas barrier layer and an area of the gas barrier layer having a depth of up to 5 nm from the surface of the gas barrier layer. The term "surface" used herein in connection with the gas barrier layer is intended to include the interface (boundary surface) with an additional layer (described later).

The oxygen atom content rate, the nitrogen atom content rate, and the silicon atom content rate in the surface layer part are measured by the method described in connection with the examples.

The film density may be calculated by X-ray reflectometry.

X-rays incident on a thin film formed on a substrate at a very low angle are totally reflected. When the incident angle of the X-rays is equal to or higher than the total reflection critical angle, the X-rays enter the thin film, and are divided into transmitted waves and reflected waves at the surface/interface of the thin film, and the reflected waves undergo interference. The film density can be determined by analyzing the total reflection critical angle. The thickness of the thin film may also be determined by performing measurement while changing the incident angle, and analyzing an interference signal of reflected waves due to a change in optical path difference.

The film density may be measured by the following method.

The refractive index n of a substance when applying X-rays, and the real part δ of the refractive index n normally satisfy the following expressions (1) and (2).

[Expression 1]

$$n = 1 - \delta - i\beta \qquad (1)$$

[Expression 2]

$$\delta = \left(\frac{r_e \lambda^2}{2\pi}\right) N_0 \rho \sum_i x_i(Z_i + f_i') \Big/ \sum_i x_i M_i \qquad (2)$$

where, $r_e$ is the electron classical radius (2.818×10$^{-15}$ m), $N_0$ is Avogadro's number, λ is the wavelength of X-rays, ρ is the density (g/cm$^3$), Zi, Mi, and xi respectively are the atomic number, the atomic weight, and the atomic number ratio (molar ratio) of the ith atom, and fi' is the atomic scattering factor (abnormal dispersion term) of the atoms of the ith atom. The total reflection critical angle θc is given by the following expression (3) when β that relates to absorption is disregarded.

[Expression 3]

$$\theta c = \sqrt{2\delta} \qquad (3)$$

Therefore, the density ρ is calculated by the following expression (4) based on the relationship between the expressions (2) and (3).

[Expression 4]

$$\rho = \frac{\theta_c^2 \sum_i x_i M_i}{\left(\frac{r_e \lambda^2}{\pi}\right) N_0 \sum_i x_i (Z_i + f_i')} \quad (4)$$

The θc can be calculated from the X-ray reflectivity. The $r_e$, $N_0$, and λ are constants, and the Zi, Mi, and fi' respectively are inherent to the constituent atom. A value obtained by XPS measurement is used as the atomic number ratio xi (molar ratio).

The film density of the surface layer part of the gas barrier layer is measured by the method described in connection with the examples, and is determined using the expression (4).

The thickness of the gas barrier layer is not particularly limited, but is normally 20 nm to 100 μm, preferably 30 to 500 nm, and more preferably 40 to 200 nm.

According to the embodiments of the invention, a formed article that exhibits a sufficient gas barrier capability can be obtained even if the gas barrier layer has a thickness at a nanometer level.

The gas barrier layer that meets the requirements (a) to (c) may preferably be a layer obtained by implanting ions into a polysilazane compound-containing layer (hereinafter may be referred to as "polysilazane layer"). Note that the layer obtained by implanting ions into the polysilazane compound-containing layer hereinafter may be referred to as "ion-implanted layer". The layer obtained by implanting ions into the polysilazane layer functions as a gas barrier layer.

The polysilazane used in connection with the embodiments of the invention is a polymer that includes a repeating unit that includes an —Si—N— bond in its molecule. Specific examples of the polysilazane include a compound that includes a repeating unit represented by the following formula (1).

[Chemical Formula 3]

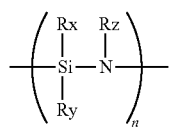

(1)

Note that n in the formula (1) is an arbitrary natural number.

Rx, Ry, and Rz independently represent a hydrogen atom or a non-hydrolyzable group such as a substituted or unsubstituted alkyl group, a substituted or unsubstituted cycloalkyl group, a substituted or unsubstituted alkenyl group, a substituted or unsubstituted aryl group, or an alkylsilyl group.

Examples of the unsubstituted alkyl group include alkyl groups having 1 to 10 carbon atoms (e.g., methyl group, ethyl group, n-propyl group, isopropyl group, n-butyl group, isobutyl group, sec-butyl group, t-butyl group, n-pentyl group, isopentyl group, neopentyl group, n-hexyl group, n-heptyl group, and n-octyl group).

Examples of the unsubstituted cycloalkyl group include cycloalkyl groups having 3 to 10 carbon atoms (e.g., cyclobutyl group, cyclopentyl group, cyclohexyl group, and cycloheptyl group).

Examples of the unsubstituted alkenyl group include alkenyl groups having 2 to 10 carbon atoms (e.g., vinyl group, 1-propenyl group, 2-propenyl group, 1-butenyl group, 2-butenyl group, and 3-butenyl group).

Examples of a substituent that may substitute the alkyl group, the cycloalkyl group, and the alkenyl group include halogen atoms such as a fluorine atom, a chlorine atom, a bromine atom, and an iodine atom; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

Examples of the unsubstituted aryl group include aryl groups having 6 to 10 carbon atoms (e.g., phenyl group, 1-naphthyl group, and 2-naphthyl group).

Examples of a substituent that may substitute the aryl group include halogen atoms such as a fluorine atom, a chlorine atom, a bromine atom, and an iodine atom; alkyl groups having 1 to 6 carbon atoms, such as a methyl group and an ethyl group; alkoxy groups having 1 to 6 carbon atoms, such as a methoxy group and an ethoxy group; a nitro group; a cyano group; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

Examples of the alkylsilyl group include a trimethylsilyl group, a triethylsilyl group, a triisopropylsilyl group, a tri-t-butylsilyl group, a methyldiethylsilyl group, a dimethylsilyl group, a diethylsilyl group, a methylsilyl group, an ethylsilyl group, and the like.

Among these, a hydrogen atom, an alkyl group having 1 to 6 carbon atoms, or a phenyl group is preferable as Rx, Ry, and Rz. A hydrogen atom is particularly preferable as Rx, Ry, and Rz.

The polysilazane compound that includes the repeating unit represented by the formula (1) may be an inorganic polysilazane in which Rx, Ry, and Rz represent a hydrogen atom, or an organic polysilazane in which at least one of Rx, Ry, and Rz does not represent a hydrogen atom.

Examples of the inorganic polysilazane include a perhydropolysilazane that has a linear structure that includes a repeating unit represented by the following formula, has a molecular weight of 690 to 2000, and includes three to ten SiH₃ groups in one molecule (see JP-B-63-16325),

[Chemical Formula 4]

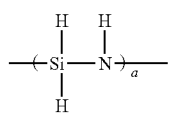

wherein a is an arbitrary natural number, a perhydropolysilazane that has a linear structure and a branched structure, and includes a repeating unit represented by the following formula (A),

[Chemical Formula 5]

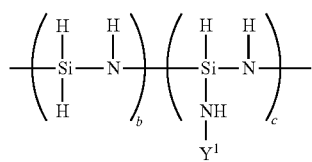

(A)

wherein b and c are arbitrary natural numbers, and $Y^1$ represents a hydrogen atom or a group represented by the following formula (B),

[Chemical Formula 6]

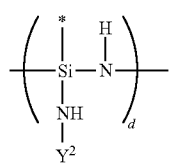

(B)

wherein d is an arbitrary natural number, * indicates the bonding position, and $Y^2$ represents a hydrogen atom or a group represented by the formula (B), a perhydropolysilazane that has a linear structure, a branched structure, and a cyclic structure in its molecule, and includes the perhydropolysilazane structure represented by the following formula (C),

[Chemical Formula 7]

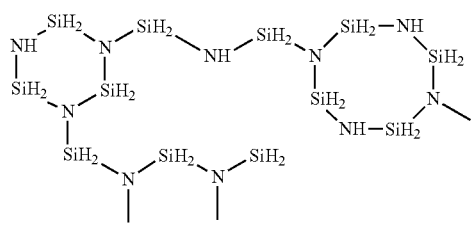

(C)

and the like.

Examples of the organic polysilazane include (i) a polysilazane that includes a repeating unit represented by —(Rx'SiHNH)— (wherein Rx' represents a substituted or unsubstituted alkyl group, a substituted or unsubstituted cycloalkyl group, a substituted or unsubstituted alkenyl group, a substituted or unsubstituted aryl group, or an alkylsilyl group (hereinafter the same)), and has a cyclic structure having a degree of polymerization of 3 to 5, (ii) a polysilazane that includes a repeating unit represented by —(Rx'SiHNRz')— (wherein Rz' represents a substituted or unsubstituted alkyl group, a substituted or unsubstituted cycloalkyl group, a substituted or unsubstituted alkenyl group, a substituted or unsubstituted aryl group, or an alkylsilyl group), and has a cyclic structure having a degree of polymerization of 3 to 5, (iii) a polysilazane that includes a repeating unit represented by —(Rx'Ry'SiNH)— (wherein Ry' represents a substituted or unsubstituted alkyl group, a substituted or unsubstituted cycloalkyl group, a substituted or unsubstituted alkenyl group, a substituted or unsubstituted aryl group, or an alkylsilyl group), and has a cyclic structure having a degree of polymerization of 3 to 5, (iv) a polyorgano(hydro)silazane that includes a structure represented by the following formula in its molecule,

[Chemical Formula 8]

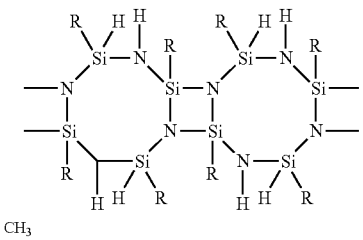

$R = CH_3$ (v) a polysilazane that includes a repeating unit represented by the following formula,

[Chemical Formula 9]

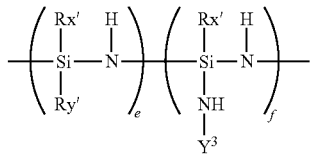

wherein Rx' and Ry' are the same as defined above, e and f are arbitrary natural numbers, and $Y^3$ represents a hydrogen atom or a group represented by the following formula (E),

[Chemical Formula 10]

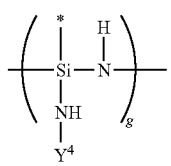

(E)

wherein g is an arbitrary natural number, * indicates the bonding position, and $Y^4$ represents a hydrogen atom or a group represented by the formula (E), and the like.

The above organic polysilazanes may be produced by a known method. For example, the above organic polysilazanes may be produced by reacting ammonia or a primary amine with a reaction product of a substituted or unsubstituted halogenosilane compound represented by the following formula (2) and a secondary amine.

[Chemical Formula 11]

$$R^1{}_{4-m}SiX_m \qquad (2)$$

wherein m is 2 or 3, X represents a halogen atom, and $R^1$ represents a substituent that substitutes Rx, Ry, Rz, Rx', Ry', or Rz'.

The secondary amine, ammonia, and the primary amine may be appropriately selected depending on the structure of the target polysilazane compound.

A modified polysilazane may also be used as the polysilazane compound. Examples of the modified polysilazane include a polymetallosilazane that includes a metal atom (which may be crosslinked), a polysiloxazane that includes a repeating unit represented by $(SiH_2)_g(NH)_h$) and a repeating unit represented by $(SiH_2)_iO$ (wherein g, h, and i are 1, 2, or 3) (see JP-A62-195024), a polyborosilazane produced by reacting a polysilazane with a boron compound (see JP-A-2-84437), a polymetallosilazane produced by reacting a polysilazane with a metal alkoxide (see JP-A-63-81122, for example), an inorganic silazane polymer and a modified polysilazane (see JP-A-1-138108, for example), a copolymer silazane produced by introducing an organic component into a polysilazane (see JP-A-2-175726, for example), a low-temperature ceramic polysilazane obtained by adding a ceramic-forming catalyst compound to a polysilazane (see JP-A-5-238827, for example), a silicon alkoxide-addition polysilazane (see JP-A-5-238827), a glycidol-addition polysilazane (see JP-A-6-122852), an acetylacetonato complex-addition polysilazane (see JP-A-6-306329), a metal carboxylate-addition polysilazane (see JP-A-6-299118, for example), a polysilazane composition produced by adding an amine and/or an acid to the above polysilazane or modified polysilazane (see JP-A-9-31333), a modified polysilazane produced by adding an alcohol (e.g., methanol) or hexamethyldisilazane to the terminal nitrogen (N) atom of perhydropolysilazane (see JP-A-5-345826 and JP-A-4-63833), and the like.

The polysilazane compound used in connection with the invention is preferably an inorganic polysilazane in which Rx, Ry, and Rz represent hydrogen atoms, or an organic polysilazane in which at least one of Rx, Ry, and Rz does not represent a hydrogen atom, and more preferably an inorganic polysilazane from the viewpoint of availability and a capability to form an implanted layer that exhibits an excellent gas barrier capability.

The number average molecular weight of the polysilazane compound is not particularly limited, but is preferably 100 to 50,000.

A product commercially available as a glass coating material or the like may be used directly as the polysilazane compound.

The polysilazane layer may include an additional component in addition to the polysilazane compound as long as the object of the invention is not impaired. Examples of the additional component include a curing agent, an additional polymer, an aging preventive, a light stabilizer, a flame retardant, and the like.

The content of the polysilazane compound in the polysilazane layer is preferably 50 wt % or more, and more preferably 70 wt % or more, so that an ion-implanted layer that exhibits an excellent gas barrier capability can be formed.

The polysilazane layer may be formed by an arbitrary method. For example, the polysilazane layer may be formed by applying a layer-forming solution that includes at least one polysilazane compound, an optional additional component, a solvent, and the like to the base layer, and appropriately drying the resulting film.

A spin coater, a knife coater, a gravure coater, or the like may be used to apply the layer-forming solution.

It is preferable to heat the resulting film in order to dry the film, and improve the gas barrier capability of the resulting gas barrier film. In this case, the film is heated at 80 to 150° C. for several tens of seconds to several tens of minutes.

According to the embodiments of the invention, the base layer does not curl, shrink, or become cloudy, or a decrease in transparency due to a plasticizer or the like does not occur, even if the film is heated at such a high temperature, and the thickness of the base layer is small.

The polysilazane layer may also be formed by causing gas of a plasma-polymerizable silazane compound (e.g., dimethyldisilazane, tetramethyldisilazane, or hexamethyldisilazane) to come in contact with a plastic gas barrier film, and subjecting the resulting product to plasma polymerization (see JP-A-9-143289).

The thickness of the polysilazane layer is not particularly limited, but is normally 20 nm to 100 µm, preferably 30 to 500 nm, and more preferably 40 to 200 nm.

According to the embodiments of the invention, a gas barrier film that exhibits a sufficient gas barrier capability can be obtained even if the polysilazane layer has a thickness at a nanometer level.

The ion-implanted layer included in the gas barrier film according to one embodiment of the invention is preferably a layer that includes at least one polysilazane compound. It is particularly preferable that the ion-implanted layer be a layer which includes at least one polysilazane compound and into which ions are implanted.

The dose may be appropriately determined depending on the intended use of the gas barrier film (e.g., gas barrier capability and transparency), and the like.

Examples of the ions implanted include ions of a rare gas such as argon, helium, neon, krypton, and xenon; ions of a fluorocarbon, hydrogen, nitrogen, oxygen, carbon dioxide, chlorine, fluorine, sulfur, and the like; ions of an alkane gas such as methane, ethane, propane, butane, pentane, and hexane; ions of an alkene gas such as ethylene, propylene, butene, and pentene; ions of an alkadiene gas such as pentadiene and butadiene; ions of an alkyne gas such as acetylene and methylacetylene; ions of an aromatic hydrocarbon gas such as benzene, toluene, xylene, indene, naphthalene, and phenanthrene; ions of a cycloalkane gas such as cyclopropane and cyclohexane; ions of a cycloalkene gas such as cyclopentene and cyclohexene (i.e., ions of a hydrocarbon); ions of conductive metals such as gold, silver, copper, platinum, nickel, palladium, chromium, titanium, molybdenum, niobium, tantalum, tungsten, and aluminum; ions of silicon compounds such as silane ($SiH_4$) and an organosilicon compound; and the like.

Examples of the organosilicon compounds include tetraalkoxysilanes such as tetramethoxysilane, tetraethoxysilane, tetra-n-propoxysilane, tetraisopropoxysilane, tetra-n-butoxysilane, and tetra-t-butoxysilane; substituted or unsubstituted alkylalkoxysilanes such as dimethyldimethoxysilane, dimethyldiethoxysilane, diethyldimethoxysilane, methyltriethoxysilane, ethyltrimethoxysilane, and (3,3,3-trifluoropropyl)trimethoxysilane; arylalkoxysilanes such as diphenyldimethoxysilane and phenyltriethoxysilane; disiloxanes such as hexamethyldisiloxane (HMDSO); aminosilanes such as bis(dimethylamino)dimethylsilane, bis(dimethylamino)methylvinylsilane, bis(ethylamino)dimethylsilane, diethylaminotrimethylsilane, dimethylaminodimethylsilane, tetrakisdimethylaminosilane, and tris(dimethylamino)silane; silazanes such as hexamethyldisilazane, hexamethylcyclotrisilazane, heptamethyldisilazane, nonamethyltrisilazane, octamethylcyclotetrasilazane, and tetramethyldisilazane; isocyanatosilanes such as tetraisocyanatosilane; halogenosilanes such as triethoxyfluorosilane; alkenylsilanes such as diallyldimethylsilane and allyltrimethylsilane; substituted or unsubstituted alkylsilanes such as di-t-butylsilane, 1,3-disilabutane, bis(trimethylsilyl)methane, tetramethylsilane, tris (trimethylsilyl)methane, tris(trimethylsilyl)silane, and benzyltrimethylsilane; silylalkynes such as bis(trimethylsilyl) acetylene, trimethylsilylacetylene, and 1-(trimethylsilyl)-1- propyne; silylalkenes such as 1,4-bistrimethylsilyl-1,3-butadiene and cyclopentadienyltrimethylsilane; arylalkylsilanes such as phenyldimethylsilane and phenyltrimethylsilane; alkynylalkylsilanes such as propargyltrimethylsilane; alkenylalkylsilanes such as vinyltrimethylsilane; disilanes such as hexamethyldisilane; siloxanes such as octamethylcyclotetrasiloxane, tetramethylcyclotetrasiloxane, and hexamethylcyclotetrasiloxane; N,O-bis(trimethylsilyl)acetamide; bis(trimethylsilyl)carbodiimide; and the like.

These compounds (ions) may be used either alone or in combination.

Among these, at least one ion selected from the group consisting of ions of hydrogen, nitrogen, oxygen, argon, helium, neon, xenon, krypton, a silicon compound, and a hydrocarbon is preferable (more preferably at least one ion selected from the group consisting of hydrogen, nitrogen, oxygen, argon, helium, neon, xenon, and krypton) due to ease of implantation and a capability to form an ion-implanted layer that exhibits an excellent gas barrier capability and excellent bending resistance.

The dose may be appropriately determined depending on the intended use of the gas barrier film (e.g., gas barrier capability and transparency), and the like.

The ion implantation method is not particularly limited. For example, a method that forms a polysilazane layer, and implants ions into the polysilazane layer may be used.

The ions may be implanted by applying ions (ion beams) accelerated by an electric field, implanting ions present in plasma, or the like. It is preferable to use a plasma ion implantation method since a gas barrier film can be easily obtained.

The plasma ion implantation method may be implemented by generating plasma in an atmosphere containing a plasma-generating gas (e.g., rare gas), and implanting ions (cations) present in the plasma into the surface area of the polysilazane layer by applying a negative high-voltage pulse to the polysilazane layer, for example.

The thickness of the ion-implanted layer may be controlled by adjusting the implantation conditions (e.g., type of ions, applied voltage, and implantation time), and may be determined depending on the thickness of the polysilazane layer, the intended use of the gas barrier film, and the like. The thickness of the ion-implanted layer is normally 10 to 1000 nm.

Whether or not the ions have been implanted may be determined by performing elemental analysis on the surface area up to a depth of about 10 nm using X-ray photoelectron spectroscopy (XPS).

The gas barrier film according to one embodiment of the invention may include only the base layer and the gas barrier layer, or may also include an additional layer as long as the object of the invention is not impaired. The additional layer may be a single layer, or may include a plurality of identical or different layers.

Examples of the additional layer include an inorganic thin film layer, a conductor layer, an impact-absorbing layer, a primer layer, and the like.

The inorganic thin film layer includes one or more inorganic compounds. The gas barrier capability can be further improved by providing the inorganic compound layer.

Examples of the inorganic compounds include inorganic compounds that can be deposited under vacuum, and exhibit a gas barrier capability, such as inorganic oxides, inorganic nitrides, inorganic carbides, inorganic sulfides, and composites thereof (e.g., inorganic oxynitride, inorganic oxycarbide, inorganic carbonitride, and inorganic oxycarbonitride).

The thickness of the inorganic thin film layer is normally 10 to 1000 nm, preferably 20 to 500 nm, and more preferably 20 to 100 nm.

Examples of a material for forming the conductor layer include metals, alloys, metal oxides, electrically conductive compounds, mixtures thereof, and the like. Specific examples of the material for forming the conductor layer include antimony-doped tin oxide (ATO); fluorine-doped tin oxide (FTO); semiconductive metal oxides such as tin oxide; germanium-doped zinc oxide (GZO), zinc oxide, indium oxide, indium tin oxide (ITO), and indium zinc oxide (IZO); metals such as gold, silver, chromium, and nickel; mixtures of these metals and a conductive metal oxide; inorganic conductive substances such as copper iodide and copper sulfide; organic conductive materials such as polyaniline, polythiophene, and polypyrrole; and the like.

The conductor layer may be formed by an arbitrary method. For example, the conductor layer may be formed by evaporation (deposition), sputtering, ion plating, thermal CVD, plasma CVD, or the like.

The thickness of the conductor layer may be appropriately selected depending on the application and the like. The thickness of the conductor layer is normally 10 nm to 50 $\mu$m, and preferably 20 nm to 20 $\mu$m.

The impact-absorbing layer protects the gas barrier layer when an impact is applied to the gas barrier layer. A material for forming the impact-absorbing layer is not particularly limited. Examples of the material for forming the impact-absorbing layer include acrylic resins, urethane resins, silicone resins, olefin resins, rubber materials, and the like.

A product commercially available as a pressure-sensitive adhesive, a coating material, a sealing material, or the like may also be used as the material for forming the impact-absorbing layer. It is preferable to use a pressure-sensitive adhesive (e.g., acrylic pressure-sensitive adhesive, silicone pressure-sensitive adhesive, or rubber pressure-sensitive adhesive).

The impact-absorbing layer may be formed by an arbitrary method. For example, the impact-absorbing layer may be formed by applying an impact-absorbing layer-forming solution that includes the material (e.g., pressure-sensitive adhesive) for forming the impact-absorbing layer and an optional component (e.g., solvent) to the layer on which the impact-absorbing layer is to be formed, drying the resulting film, and optionally heating the dried film in the same manner as in the case of forming the polysilazane compound-containing layer.

Alternatively, the impact-absorbing layer may be formed on a release base, and transferred to the layer on which the impact-absorbing layer is to be formed.

The thickness of the impact-absorbing layer is normally 1 to 100 $\mu$m, and preferably 5 to 50 $\mu$m.

The primer layer improves interlayer adhesion between the base layer and the gas barrier layer. A gas barrier film that exhibits excellent interlayer adhesion and surface flatness can be obtained by providing the primer layer.

An arbitrary known material may be used to form the primer layer. Examples of the material for forming the primer layer include silicon-containing compounds; a photopolymerizable composition that includes a photopolymerizable compound formed of a photopolymerizable monomer and/or a photopolymerizable prepolymer, and an initiator that generates radicals at least due to visible light; resins such as a polyester resin, a polyurethane resin (particularly a two-component curable resin that includes an isocyanate compound and a polyacryl polyol, a polyester polyol, a polyether polyol, or the like), an acrylic resin, a polycarbonate resin, a vinyl chloride/vinyl acetate copolymer, a polyvinyl butyral resin, and a nitrocellulose resin; alkyl titanates; ethyleneimine; and the like. These materials may be used either alone or in combination.

The primer layer may be formed by dissolving or dispersing the material for forming the primer layer in an appropriate solvent to prepare a primer layer-forming solution, applying the primer layer-forming solution to one side or each side of the base layer, drying the resulting film, and optionally heating the dried film.

The primer layer-forming solution may be applied to the base layer by a normal wet coating method. Examples of the wet coating method include dipping, roll coating, gravure coating, knife coating, air knife coating, roll knife coating, die coating, screen printing, spray coating, a gravure offset method, and the like.

The film formed by applying the primer layer-forming solution may be dried by hot-blast drying, heat roll drying, infrared irradiation, or the like. The thickness of the primer layer is normally 10 to 1000 nm.

Ions may be implanted into the primer layer in the same manner as in the case of forming the ion-implanted layer (described later). A gas barrier film that exhibits a more excellent gas barrier capability can be obtained by implanting ions into the primer layer.

When the gas barrier film according to one embodiment of the invention is a laminate that includes an additional layer other than the base layer and the gas barrier layer, the gas barrier layer may be situated at an arbitrary position. The gas barrier film may include one gas barrier layer, or may include a plurality of gas barrier layers. The additional layer may be situated at an arbitrary position. The additional layer may be provided on the gas barrier layer, or may be provided between the gas barrier layer and the base layer, or may be provided on the base layer.

The thickness of the gas barrier film according to one embodiment of the invention may be appropriately determined depending on the application of the target electronic device.

The gas barrier film according to one embodiment of the invention exhibits an excellent gas barrier capability, excellent transparency, excellent bending resistance, and excellent heat resistance.

The gas barrier film according to one embodiment of the invention exhibits an excellent gas barrier capability since the gas barrier film has a low water vapor transmission rate. The water vapor transmission rate of the gas barrier film at a temperature of 40° C. and a relative humidity of 90% is normally less than 0.50 g/m$^2$/day, preferably 0.30 g/m$^2$/day or less, more preferably 0.10 g/m$^2$/day or less, and still more preferably 0.05 g/m$^2$/day or less.

The water vapor transmission rate of the gas barrier film may be measured using a known gas transmission rate measurement system.

Whether or not the gas barrier film according to one embodiment of the invention exhibits excellent bending resistance, and maintains its gas barrier capability even when the gas barrier film is bent may be determined by bending the gas barrier film, applying a pressure to the gas barrier film, and determining whether or not cracks have occurred, and the water vapor transmission rate has increased to a large extent after unbending the gas barrier film. The gas barrier film according to one embodiment of the invention advantageously maintains its gas barrier capability as compared with an inorganic film having an identical thickness even when the gas barrier film is bent.

The gas barrier film according to one embodiment of the invention exhibits excellent transparency since the gas barrier film has a small haze value. The haze value is preferably 8.0 or less, more preferably 5.0 or less, and still more preferably 3.0 or less.

The haze value may be measured using a known haze meter. The haze value is measured by the method described in connection with the examples.

The gas barrier film according to one embodiment of the invention exhibits excellent heat resistance since the base layer includes the resin having a glass transition temperature (Tg) of more than 130° C. The gas barrier film according to one embodiment of the invention does not curl, shrink, or become cloudy, or a decrease in transparency due to a plasticizer or the like does not occur, even if the gas barrier film is subjected to a high temperature.

2) Process for Producing Gas Barrier Film

A process for producing a gas barrier film according to one embodiment of the invention includes forming a polysilazane compound-containing layer on a base layer that includes a resin having a glass transition temperature (Tg) of more than 130° C., and implanting ions into a surface area of the polysilazane compound-containing layer.

The polysilazane compound-containing layer may be formed on the base layer that includes the resin having a glass transition temperature (Tg) of more than 130° C. using the method that forms the polysilazane layer on the base layer, for example.

It is preferable to produce the gas barrier film by implanting ions into a surface area of a polysilazane compound-containing layer of a long formed body that includes a base layer that includes a resin having a glass transition temperature (Tg) of more than 130° C., and the polysilazane compound-containing layer that is formed on the base layer.

According to this method, ions can be implanted into the long formed body wound around a feed-out roll while feeding the formed body in a given direction, which can then be wound around a wind-up roll, for example. Therefore, an ion-implanted gas barrier film can be continuously produced.

The long formed body may include an additional layer other than the base layer as long as the polysilazane layer is formed in the surface area. Examples of the additional layer include those mentioned above.

The thickness of the formed body is preferably 1 to 500 μm, and more preferably 5 to 300 μm, from the viewpoint of winding/unwinding operability and feeding operability.

The ions may be implanted into the polysilazane layer by an arbitrary method. It is preferable to implant the ions into the surface area of the polysilazane layer by a plasma ion implantation method.

The plasma ion implantation method includes applying a negative high-voltage pulse to the formed body that includes the polysilazane layer in its surface area and is exposed to plasma, to implant ions present in the plasma into the surface area of the polysilazane layer.

It is preferable to use (A) a plasma ion implantation method that implants ions present in plasma generated by utilizing an external electric field into the surface area of the polysilazane layer, or (B) a plasma ion implantation method that implants ions present in plasma generated due to an electric field produced by applying a negative high-voltage pulse to the polysilazane layer, into the surface area of the polysilazane layer.

When using the method (A), it is preferable to set the ion implantation pressure (plasma ion implantation pressure) to 0.01 to 1 Pa. When the plasma ion implantation pressure is within the above range, a uniform ion-implanted layer can be formed conveniently and efficiently. This makes it possible to efficiently form an ion-implanted layer that exhibits transparency and a gas barrier capability.

The method (B) does not require increasing the degree of decompression, allows a simple operation, and significantly reduces the processing time. Moreover, the entire polysilazane layer can be uniformly processed, and ions present in the plasma can be continuously implanted into the surface area of the polysilazane layer with high energy when applying a negative high-voltage pulse. The method (B) also has an advantage in that an excellent ion-implanted layer can be uniformly formed in the surface area of the polysilazane layer by merely applying a negative high-voltage pulse to the polysilazane layer without requiring a special means such as a high-frequency power supply (e.g., radio frequency (RF) power supply or microwave power supply).

When using the method (A) or (B), the pulse width when applying a negative high-voltage pulse (i.e., during ion implantation) is preferably 1 to 15 μs. When the pulse width is within the above range, a transparent and uniform ion-implanted layer can be formed more conveniently and efficiently.

The voltage applied when generating plasma is preferably −1 to −50 kV, more preferably −1 to −30 kV, and particularly preferably −5 to −20 kV. If the applied voltage is higher than −1 kV, the dose may be insufficient, so that the desired performance may not be obtained. If the applied voltage is lower than −50 kV, the gas barrier film may be electrically charged during ion implantation, or the gas barrier film may be colored, for example.

The ion species used for plasma ion implantation may be the same as described above. It is preferable to use ions of hydrogen, nitrogen, oxygen, argon, helium, neon, xenon, krypton, a silicon compound, or a hydrocarbon due to ease of ion implantation and a capability to form a gas barrier film that exhibits transparency and an excellent gas barrier capability. It is more preferable to use ions of hydrogen, nitrogen, oxygen, argon, helium, neon, xenon, or krypton.

A plasma ion implantation system is used when implanting ions present in plasma into the surface area of the polysilazane layer.

Specific examples of the plasma ion implantation system include (a) a system that causes the polysilazane layer (hereinafter may be referred to as "ion implantation target layer") to be evenly enclosed by plasma by superimposing high-frequency electric power on a feed-through that applies a negative high-voltage pulse to the ion implantation target layer so that ions present in the plasma are attracted to and collide with the target, and thereby implanted and deposited therein (JP-A-2001-26887), (β) a system that includes an antenna in a chamber, wherein high-frequency electric power is applied to generate plasma, and positive and negative pulses are alternately applied to the ion implantation target layer after the plasma has reached an area around the ion implantation target layer, so that ions present in the plasma are attracted to and implanted into the target while heating the ion implantation target layer, causing electrons present in the plasma to be attracted to and collide with the target due to the positive pulse, and applying the negative pulse while controlling the temperature by controlling the pulse factor (JP-A-2001-156013), (γ) a plasma ion implantation system that generates plasma using an external electric field utilizing a high-frequency electric power supply such as a microwave power supply, and causes ions present in the plasma to be attracted to and implanted into the target by applying a high-voltage pulse, (δ) a plasma ion implantation system that implants ions present in plasma generated due to an electric field produced by applying a high-voltage pulse without using an external electric field, and the like.

It is preferable to use the plasma ion implantation system (γ) or (δ) since the plasma ion implantation system (γ) or (δ) allows a simple operation, significantly reduces the processing time, and can be continuously used.

A method that utilizes the plasma ion implantation system (γ) or (δ) is described in WO2010/021326.

Since the plasma ion implantation system (γ) or (δ) is configured so that the high-voltage pulsed power supply also serves as a plasma generation means, a special means such as a high-frequency electric power supply (e.g., RF power supply or microwave power supply) is unnecessary. An ion-implanted layer can be continuously formed by implanting ions present in the plasma into the surface area of the polysilazane layer by merely applying a negative high-voltage pulse. Therefore, a gas barrier film in which an ion-implanted layer is formed in its surface area can be mass-produced.

3) Electronic Device Member and Electronic Device

An electronic device member according to one embodiment of the invention includes the gas barrier film according to one embodiment of the invention. Therefore, since the electronic device member according to one embodiment of the invention exhibits an excellent gas barrier capability, a deterioration in an element (member or device) due to gas (e.g., water vapor) can be prevented. Since the electronic device member exhibits excellent light transmittance and heat resistance, the electronic device member may suitably be used as a display member for touch panels, liquid crystal displays, EL displays, and the like; a solar cell backsheet; and the like.

An electronic device according to one embodiment of the invention includes the electronic device member according to one embodiment of the invention. Specific examples of the electronic device include a touch panel, a liquid crystal display, an organic EL display, an inorganic EL display, electronic paper, a solar cell, and the like.

Since the electronic device according to one embodiment of the invention includes the electronic device member that includes the gas barrier film according to one embodiment of the invention, the electronic device exhibits an excellent gas barrier capability, excellent transparency, excellent bending resistance, and excellent heat resistance.

EXAMPLES

The invention is further described below by way of examples. Note that the invention is not limited to the following examples.

The following X-ray photoelectron spectrometer, X-ray reflectometry film density measurement method, plasma ion implantation system, water vapor transmission rate measurement system, water vapor transmission rate measurement conditions, haze measurement system, and bending test method were used. Note that a system that implants ions using an external electric field was used as the plasma ion implantation system.

X-Ray Photoelectron Spectrometer

The oxygen atom content rate, the nitrogen atom content rate, and the silicon atom content rate in the surface layer part of the gas barrier layer (i.e., a layer obtained by ion implantation) were measured under the following measurement conditions.

Measurement system: "PHI Quantera SXM" manufactured by ULVAC-PHI, Incorporated
X-ray source: AlKα
X-ray beam diameter: 100 μm
Electric power: 25 W
Voltage: 15 kV Take-off angle: 45°
Degree of vacuum: $5.0 \times 10^{-8}$ Pa
X-Ray Photoelectron Spectroscopy Film Density Measurement Method The X-ray reflectance was measured under the following measurement conditions to determine the total reflection critical angle θc, and the film density in the surface area of the gas barrier layer was calculated from the total reflection critical angle θc using the expression (4).

The following measurement system and measurement conditions were used.
Measurement system: X-ray diffractometer "SmartLab" (manufactured by Rigaku Corporation)
Measurement Conditions
X-ray source: Cu—Kα1 (wavelength: 1.54059 Å)
Optical system: parallel beam optical system
Incident-side slit system: Ge(220)$_2$ crystal, height-limiting slit: 5 mm, incident slit: 0.05
Receiving-side slit system: receiving slit: 0.10 mm, soller slit: 5°
Detector: scintillation counter
Tube voltage-tube current: 45 kV-200 mA
Scan axis: 2θ/θ
Scan mode: continuous scan
Scan range: 0.1 to 3.0 deg.
Scan speed: 1 deg./min
Sampling interval: 0.002°/step The oxygen atom content rate, the nitrogen atom content rate, and the silicon atom content rate in the surface layer part of the gas barrier layer measured by X-ray photoelectron spectroscopy were used for the atomic number ratio (xi).
Plasma Ion Implantation System
RF power supply: "RF56000" manufactured by JEOL Ltd.
High-voltage pulse power supply: "PV-3-HSHV-0835" manufactured by Kurita Seisakusho Co., Ltd.
Measurement of Water Vapor Transmission Rate
Water vapor transmission rate measurement system: "PERMATRAN-W3/33" manufactured by Mocon
Measurement conditions: relative humidity: 90%, temperature: 40° C.
Measurement of Haze Value The haze value of the gas barrier film and the haze value of the base layer before forming the polysilazane layer were measured by measuring the diffuse transmittance (Td %) and the total light transmittance (Tt %) in accordance with JIS K 7105 using an integrating sphere light transmittance measurement system ("NDH-2000" manufactured by Nippon Denshoku Industries Co, Ltd.). The haze value (%) was calculated by the following expression. The results are shown in Table 1.

[Expression 5]

Haze value=$Td/Tt \times 100$

Bending Resistance Test

The gas barrier film was bent at its center so that the ion-implanted side (i.e., the side of the polysilazane layer in Comparative Example 1, and the side of the silicon nitride film in Comparative Example 3) was positioned outside. The gas barrier film was passed through the space between two rolls of a laminator ("LAMIPACKER LPC1502" manufactured by Fujipla, Inc.) at a temperature of 23° C. and a lamination speed of 5 m/min.

The bending test was performed in a state in which a pasteboard (thickness: 1 mm) was provided on the inner side of the gas barrier film.

Example 1

(i) Preparation of Base Layer

Pellets of a polysulfone resin ("Ultrason S3010" manufactured by BASF, Tg=187° C.) were dissolved in 1,3-dioxolane to prepare a 30 wt % polysulfone solution. The solution was applied to the treated side and the opposite side of a polyethylene terephthalate film ("Cosmoshine PET50A-4100" manufactured by Toyobo Co., Ltd.) (hereinafter referred to as "PET film"). The resulting film was dried at 60° C. for 8 hours, and then dried at 150° C. for 3 hours. The PET film was then removed to obtain a polysulfone film (thickness: 60 μm) (film "A" in Table 1).

(ii) Preparation of Gas Barrier Layer

A coating material containing perhydropolysilazane as the main component ("Aquamika NL110A-20" manufactured by Clariant Japan K.K.) was spin-coated onto the polysulfone film, and heated at 130° C. for 1 minute to obtain a polysilazane layer (thickness: 60 nm) (polysilazane layer "A" in Table 1), to obtain a formed body. Argon (Ar) ions were implanted into the surface of the polysilazane layer using the plasma ion implantation system to obtain a gas barrier film 1.

The plasma ion implantation conditions are shown below.
Gas flow rate: 100 sccm
Duty ratio: 0.5%
Repetition frequency: 1000 Hz
Applied voltage: −10 kV
RF power supply: frequency: 13.56 MHz, applied electric power: 1000 W
Chamber internal pressure: 0.2 Pa
Pulse width: 5 μs
Processing time (ion implantation time): 5 min
Line (feed) speed: 0.2 m/min Example 2

A gas barrier film 2 was obtained in the same manner as in Example 1, except that the coating material was heated at 130° C. for 5 minutes instead of 1 minute.

Example 3

A gas barrier film 3 was obtained in the same manner as in Example 2, except that the thickness of the polysilazane layer was changed from 60 nm to 100 nm.

Example 4

A gas barrier film 4 was obtained in the same manner as in Example 2, except that the thickness of the polysilazane layer was changed from 60 nm to 150 nm.

Example 5

A gas barrier film 5 was obtained in the same manner as in Example 1, except that the coating material was heated at 130° C. for 20 minutes instead of 1 minute.

Example 6

A gas barrier film 6 was obtained in the same manner as in Example 2, except that nitrogen (N$_2$) was used as the plasma-generating gas instead of argon.

Example 7

A gas barrier film 7 was obtained in the same manner as in Example 2, except that the applied voltage during ion implantation was changed from −10 kV to −5 kV.

Example 8

A gas barrier film 8 was obtained in the same manner as in Example 2, except that the applied voltage during ion implantation was changed from −10 kV to −15 kV.

Example 9

A gas barrier film 9 was obtained in the same manner as in Example 2, except that a polysilazane layer (polysilazane layer "B" in Table 1) that was formed in the same manner as in Example 2, except that a coating material containing a mixture of saturated hydrocarbon group-containing organopolysilazane compounds as the main component ("tutoProm Bright" manufactured by Clariant Japan K.K.), was used instead of the polysilazane layer A.

Example 10

A gas barrier film 10 was obtained in the same manner as in Example 2, except that hydrogen ($H_2$) was used as the plasma-generating gas instead of argon.

Example 11

A gas barrier film 11 was obtained in the same manner as in Example 2, except that oxygen ($O_2$) was used as the plasma-generating gas instead of argon.

Example 12

A gas barrier film 12 was obtained in the same manner as in Example 2, except that helium (He) was used as the plasma-generating gas instead of argon.

Example 13

A gas barrier film 13 was obtained in the same manner as in Example 2, except that neon (Ne) was used as the plasma-generating gas instead of argon.

Example 14

A gas barrier film 14 was obtained in the same manner as in Example 2, except that xenon (Xe) was used as the plasma-generating gas instead of argon.

Example 15

A gas barrier film 15 was obtained in the same manner as in Example 2, except that krypton (Kr) was used as the plasma-generating gas instead of argon.

Example 16

(i) Preparation of Base Layer

Pellets of a polycarbonate resin ("Tarflon LC1700" manufactured by Idemitsu Kosan Co., Ltd., Tg=145° C.) were dissolved in dichloromethane to prepare a 10 wt % polycarbonate solution. The solution was applied to a PET film. The resulting film was dried at 60° C. for 8 hours, and then dried at 130° C. for 3 hours. The PET film was then removed to obtain a polycarbonate film (thickness: 50 μm) (film "B" in Table 1).

(ii) Preparation of Gas Barrier Layer

A gas barrier film 16 was obtained in the same manner as in Example 2, except that the polycarbonate film was used instead of the polysulfone film.

Example 17

(i) Preparation of Base Layer

Pellets of a polyallylate resin ("U-Polymer U-1001A" manufactured by Unitika Ltd., Tg=195° C.) were dissolved in dichloromethane to prepare a 15 wt % polyallylate solution. The solution was applied to a PET film. The resulting film was dried at 60° C. for 8 hours, and then dried at 150° C. for 3 hours. The PET film was then removed to obtain a polyallylate film (thickness: 50 μm) (film "C" in Table 1).

(ii) Preparation of Gas Barrier Layer

A gas barrier film 17 was obtained in the same manner as in Example 2, except that the polyallylate film was used instead of the polysulfone film.

Example 18

A gas barrier film 18 was obtained in the same manner as in Example 2, except that an alicyclic hydrocarbon resin film ("Zeonor ZF16" manufactured by Zeon Kasei Co., Ltd., thickness: 100 μm, Tg=155° C.) (film "D" in Table 1) was used instead of the polysulfone film.

Comparative Example 1

A gas barrier film was obtained in the same manner as in Example 1, except that ion implantation was not performed. Specifically, a polysilazane layer was formed on the polysulfone film to obtain a gas barrier film 1r.

Comparative Example 2

A gas barrier film was obtained in the same manner as in Example 1, except that the polysilazane layer was not formed on the polysulfone film. Specifically, argon ions were implanted into the surface of the polysulfone film to obtain a gas barrier film 2r.

Comparative Example 3

A silicon nitride (SiN) film (thickness: 60 nm) was formed on a polysulfone film by sputtering to obtain a gas barrier film 3r.

Comparative Example 4

A gas barrier film 4r was obtained in the same manner as in Example 2, except that the polysilazane layer was subjected to a plasma treatment using argon (Ar) as a plasma-generating gas instead of implanting ion into the polysilazane layer. The plasma treatment was performed in a state in which plasma ion implantation did not occur by setting the applied voltage of the apparatus to 0 kV.

Comparative Example 5

A gas barrier film 5r was obtained in the same manner as in Example 2, except that a polyethylene terephthalate film ("PET50T-61M" manufactured by Toray Industries Inc., thickness: 50 μm, Tg=70° C.) (film "E" in Table 1) was used instead of the polysulfone film.

Comparative Example 6

(i) Preparation of Base Layer

A poly(methyl methacrylate) powder (manufactured by Aldrich, Tg=110° C.) was dissolved in a mixed solvent of methyl ethyl ketone and toluene (weight ratio: 50:50) to prepare a 20 wt % poly(methyl methacrylate) solution. The solution was applied to a PET film. The resulting film was dried at 60° C. for 8 hours, and then dried at 110° C. for 3 hours. The PET film was then removed to obtained a poly(methyl methacrylate) film (thickness: 55 μm) (film "F" in Table 1).

(ii) Preparation of Gas Barrier Layer

A gas barrier film 6r was obtained in the same manner as in Example 2, except that the poly(methyl methacrylate) film was used instead of the polysulfone film.

In Examples 1 to 18 and Comparative Examples 2, 4, 5, and 6, implantation of ions was confirmed by subjecting the surface area of the gas barrier film up to a depth of about 10 nm to elemental analysis using an XPS system (manufactured by ULVAC-PHI, Incorporated).

Table 1 shows the type of the base layer, the heating time (min) employed when obtaining the formed body, the type and the thickness (nm) of the polysilazane layer, the type of the plasma-generating gas, and the applied voltage (kV) used in each example and comparative example.

The oxygen atom content rate, the nitrogen atom content rate, the silicon atom content rate, and the film density in the surface area of the gas barrier layer of the gas barrier films 1 to 18 and 1r to 6r were measured. The results are shown in Table 1.

TABLE 1

| | Base film (layer) | Polysilazane layer | Heating time (m) | Thickness (nm) of polysilazane layer | Plasma-generating gas | Applied voltage (kV) | Content rate (%) Oxygen atom | Nitrogen atom | Silicon atom | Film density (g/cm$^2$) |
|---|---|---|---|---|---|---|---|---|---|---|
| Example 1 | A | A | 1 | 60 | Ar | −10 | 63.22 | 7.21 | 29.57 | 2.60 |
| Example 2 | A | A | 5 | 60 | Ar | −10 | 63.05 | 5.89 | 31.06 | 3.28 |
| Example 3 | A | A | 5 | 100 | Ar | −10 | 63.21 | 5.69 | 31.10 | 3.37 |
| Example 4 | A | A | 5 | 150 | Ar | −10 | 63.10 | 5.36 | 31.54 | 3.56 |
| Example 5 | A | A | 20 | 60 | Ar | −10 | 63.54 | 5.13 | 31.33 | 3.19 |
| Example 6 | A | A | 5 | 60 | N$_2$ | −10 | 69.51 | 1.40 | 29.09 | 3.32 |
| Example 7 | A | A | 5 | 60 | Ar | −5 | 67.68 | 2.47 | 29.85 | 2.76 |
| Example 8 | A | A | 5 | 60 | Ar | −15 | 69.01 | 0.15 | 30.84 | 3.02 |
| Example 9 | A | B | 5 | 60 | Ar | −10 | 60.58 | 5.21 | 34.21 | 2.54 |
| Example 10 | A | A | 5 | 60 | H$_2$ | −10 | 71.00 | 0.19 | 28.81 | 2.71 |
| Example 11 | A | A | 5 | 60 | O$_2$ | −10 | 68.21 | 2.22 | 29.57 | 3.15 |
| Example 12 | A | A | 5 | 60 | He | −10 | 71.60 | 0.68 | 27.72 | 2.63 |
| Example 13 | A | A | 5 | 60 | Ne | −10 | 70.22 | 1.67 | 28.11 | 2.70 |
| Example 14 | A | A | 5 | 60 | Xe | −10 | 65.82 | 4.73 | 29.45 | 2.91 |
| Example 15 | A | A | 5 | 60 | Kr | −10 | 66.80 | 3.59 | 29.61 | 2.89 |
| Example 16 | B | A | 5 | 60 | Ar | −10 | 63.05 | 5.89 | 31.06 | 3.28 |
| Example 17 | C | A | 5 | 60 | Ar | −10 | 63.05 | 5.89 | 31.06 | 3.28 |
| Example 18 | D | A | 5 | 60 | Ar | −10 | 63.05 | 5.89 | 31.06 | 3.28 |
| Comparative Example 1 | A | A | 1 | 60 | — | — | 63.32 | 4.20 | 32.48 | 1.63 |
| Comparative Example 2 | A | — | — | — | Ar | −10 | — | — | — | 1.51 |
| Comparative Example 3 | A | (SiN) | — | (60) | — | — | 0.01 | 64.78 | 35.21 | 2.30 |
| Comparative Example 4 | A | A | 5 | 60 | Ar | 0 | 57.11 | 12.86 | 30.03 | 2.21 |
| Comparative Example 5 | E | A | 5 | 60 | Ar | −10 | 63.05 | 5.89 | 31.06 | 3.28 |
| Comparative Example 6 | F | A | 5 | 60 | Ar | −10 | 63.05 | 5.89 | 31.06 | 3.28 |

The water vapor transmission rate of the gas barrier films 1 to 18 and 1r to 6r obtained in the examples and the comparative examples was measured before and after the bending test. The presence or absence of cracks was visually observed after the bending test. A case where cracks were observed is indicated by "Yes", and a case where cracks were not observed is indicated by "No".

The haze value of the base layer before forming the polysilazane layer, and the haze value of the gas barrier films 1 to 18 and 1r to 6r were also measured. The results are shown in Table 2.

TABLE 2

| | Gas barrier film | Haze (%) | | Water vapor transmission rate (g/m²/day) | | |
| --- | --- | --- | --- | --- | --- | --- |
| | | Base layer (before forming polysilazane layer) | Gas barrier film | Before bending test | After bending test | Cracks |
| Example 1 | 1 | 0.5 | 0.6 | 0.20 | 0.32 | No |
| Example 2 | 2 | 0.5 | 0.7 | 0.03 | 0.07 | No |
| Example 3 | 3 | 0.5 | 0.9 | 0.0065 | 0.01 | No |
| Example 4 | 4 | 0.5 | 0.8 | 0.0059 | 0.01 | No |
| Example 5 | 5 | 0.5 | 0.9 | 0.03 | 0.08 | No |
| Example 6 | 6 | 0.5 | 0.7 | 0.04 | 0.08 | No |
| Example 7 | 7 | 0.5 | 0.7 | 0.05 | 0.07 | No |
| Example 8 | 8 | 0.5 | 0.7 | 0.01 | 0.08 | No |
| Example 9 | 9 | 0.5 | 0.8 | 0.07 | 0.08 | No |
| Example 10 | 10 | 0.5 | 0.7 | 0.07 | 0.08 | No |
| Example 11 | 11 | 0.5 | 0.7 | 0.05 | 0.09 | No |
| Example 12 | 12 | 0.5 | 0.7 | 0.05 | 0.07 | No |
| Example 13 | 13 | 0.5 | 0.7 | 0.05 | 0.07 | No |
| Example 14 | 14 | 0.5 | 0.7 | 0.07 | 0.09 | No |
| Example 15 | 15 | 0.5 | 0.7 | 0.08 | 0.10 | No |
| Example 16 | 16 | 0.9 | 1.0 | 0.03 | 0.07 | No |
| Example 17 | 17 | 0.8 | 0.9 | 0.03 | 0.07 | No |
| Example 18 | 18 | 0.3 | 0.4 | 0.03 | 0.07 | No |
| Comparative Example 1 | 1r | 0.5 | 0.6 | 10.32 | 10.92 | No |
| Comparative Example 2 | 2r | 0.5 | 0.6 | 7.98 | 8.07 | No |
| Comparative Example 3 | 3r | 0.5 | 1.0 | 0.25 | 1.21 | Yes |
| Comparative Example 4 | 4r | 0.5 | 0.6 | 12.58 | 13.55 | No |
| Comparative Example 5 | 5r | 0.9 | 15.0 | 0.03 | 0.07 | No |
| Comparative Example 6 | 6r | 0.7 | 5.0 | 3.0 | 4.8 | No |

As shown in Table 2, the gas barrier films 1 to 18 obtained in Examples 1 to 18 had a low water vapor transmission rate (i.e., exhibited an excellent gas barrier capability) as compared with the gas barrier films 1r to 6r obtained in Comparative Examples 1 to 6. No cracks were observed in the gas barrier films 1 to 18 obtained in Examples 1 to 18 after the bending test. The gas barrier films 1 to 18 obtained in Examples 1 to 18 showed a small increase in water vapor transmission rate (i.e., exhibited excellent bending resistance) as compared with the gas barrier film 3r of Comparative Example 3 in which the inorganic film (silicon nitride film) was formed.

The gas barrier films 1 to 18 obtained in Examples 1 to 18 showed a small increase in haze value as compared with the gas barrier films 5r and 6r obtained in Comparative Examples 5 and 6 before and after forming polysilazane layer. In Examples 1 to 18, the base layer did not become cloudy (i.e., exhibited excellent transparency and heat resistance) even if the polysilazane layer was dried by heating.

The invention claimed is:

1. A gas barrier film comprising a base layer, and a gas barrier layer that is provided on at least one side of the base layer, the base layer including a resin having a glass transition temperature (Tg) of more than 130° C., the gas barrier layer being formed of a material that includes at least an oxygen atom and a silicon atom, a surface layer part of the gas barrier layer having an oxygen atom content rate of 60 to 75%, a nitrogen atom content rate of 0 to 10%, and a silicon atom content rate of 25 to 35%, based on a total content rate of oxygen atoms, nitrogen atoms, and silicon atoms, and the surface layer part of the gas barrier layer having a film density of 2.4 to 4.0 g/cm³.

2. The gas barrier film according to claim 1, wherein the material that forms the gas barrier layer includes a polysilazane compound.

3. The gas barrier film according to claim 2, wherein the polysilazane compound is perhydropolysilazane.

4. A process of producing the gas barrier film according to claim 2, the process comprising forming a polysilazane compound-containing layer on a base layer that includes a resin having a glass transition temperature (Tg) of more than 130° C., and implanting ions into a surface area of the polysilazane compound-containing layer.

5. The process according to claim 4, comprising forming a polysilazane compound-containing layer on a base layer that includes a resin having a glass transition temperature (Tg) of more than 130° C. and implanting ions of at least one gas selected from a group consisting of hydrogen, nitrogen, oxygen, argon, helium, neon, xenon, krypton, a silicon compound, and a hydrocarbon into a surface area of the polysilazane compound-containing layer.

6. The process according to claim 4, comprising forming a polysilazane compound-containing layer on a base layer that includes a resin having a glass transition temperature (Tg) of more than 130° C., and implanting ions of at least one gas selected from a group consisting of hydrogen, nitrogen, oxygen, argon, helium, neon, xenon, krypton, a silicon compound, and a hydrocarbon into a surface area of the polysilazane compound-containing layer by a plasma ion implantation method.

7. The gas barrier film according to claim 2, wherein the gas barrier layer is obtained by implanting ions into a polysilazane compound-containing layer.

8. The gas barrier film according to claim 2, wherein the base layer includes at least one resin selected from a group consisting of a polysulfone resin, a polyallylate resin, and an alicyclic hydrocarbon resin.

9. The gas barrier film according to claim 1, wherein the gas barrier layer is obtained by implanting ions into a polysilazane compound-containing layer.

10. The gas barrier film according to claim 9, wherein the ions are obtained by ionizing at least one gas selected from a group consisting of hydrogen, nitrogen, oxygen, argon, helium, neon, xenon, krypton, a silicon compound, and a hydrocarbon.

11. The gas barrier film according to claim 10, wherein the gas barrier layer is obtained by implanting the ions into the polysilazane compound-containing layer by a plasma ion implantation method.

12. The gas barrier film according to claim 10, wherein the polysilazane compound is perhydropolysilazane.

13. The gas barrier film according to claim 9, wherein the gas barrier layer is obtained by implanting the ions into the polysilazane compound-containing layer by a plasma ion implantation method.

14. The gas barrier film according to claim 13, wherein the polysilazane compound is perhydropolysilazane.

15. The gas barrier film according to claim 9, wherein the polysilazane compound is perhydropolysilazane.

16. The gas barrier film according to claim 9, wherein the base layer includes at least one resin selected from a group consisting of a polysulfone resin, a polyallylate resin, and an alicyclic hydrocarbon resin.

17. The gas barrier film according to claim 1, wherein the base layer includes at least one resin selected from a group consisting of a polysulfone resin, a polyallylate resin, and an alicyclic hydrocarbon resin.

18. The gas barrier film according to claim 1, the gas barrier film having a haze value of 8.0% or less.

19. An electronic device member comprising the gas barrier film according to claim 1.

20. An electronic device comprising the electronic device member according to claim 19.

* * * * *